United States Patent [19]

Enomoto

[11] Patent Number: 5,506,159

[45] Date of Patent: Apr. 9, 1996

[54] METHOD FOR MANUFACTURING A SEMICONDUCTOR MEMORY DEVICE

[75] Inventor: Shuichi Enomoto, Tokyo, Japan

[73] Assignee: NEC Corporation, Tokyo, Japan

[21] Appl. No.: 365,233

[22] Filed: Dec. 28, 1994

[30]  Foreign Application Priority Data

Dec. 28, 1993 [JP] Japan .................................. 5-348946

[51] Int. Cl.⁶ .............................................. H01L 21/8247
[52] U.S. Cl. .............................................. 437/43; 437/52
[58] Field of Search ................................ 437/34, 43, 48, 437/57, 52

[56]  References Cited

U.S. PATENT DOCUMENTS

| | | | |
|---|---|---|---|
| 4,766,088 | 8/1988 | Kono et al. | 437/52 |
| 5,036,018 | 7/1991 | Mazzali | 437/43 |
| 5,094,967 | 5/1992 | Shinada et al. | 437/43 |
| 5,132,239 | 7/1992 | Ghezzi et al. | 437/43 |
| 5,153,144 | 10/1992 | Komori et al. | 437/43 |
| 5,158,902 | 10/1992 | Hanada | 437/43 |
| 5,292,681 | 3/1994 | Lee et al. | 437/48 |

FOREIGN PATENT DOCUMENTS

| | | | |
|---|---|---|---|
| 0592039A2 | 4/1994 | European Pat. Off. | 437/43 |
| 63-31868 | 12/1988 | Japan . | |
| 2-192723 | 7/1990 | Japan . | |

*Primary Examiner*—George Fourson
*Assistant Examiner*—Richard A. Booth
*Attorney, Agent, or Firm*—Young & Thompson

[57]  ABSTRACT

A method for manufacturing semiconductor memory device is capable of forming a first diffused layer in a memory cell portion and a second diffused layer in a peripheral portion in respective optimum conditions independently of each other without increasing the masking costs. The method includes steps of forming a polysilicon film covering the entire main surface of the substrate, patterning the polysilicon film in the memory cell portion without patterning the polysilicon film in the peripheral portion, performing a first ion implantation on the main surface to form the first diffused layer in the memory cell portion, while keeping the peripheral portion covered with the second polysilicon film, patterning the second polysilicon film in the peripheral portion to form a gate electrode, and performing a second ion implantation to form the second diffused layer in the peripheral portion. The first ion implantation is performed with the second polysilicon film being grounded for avoiding build-up of electrostatic charges.

3 Claims, 7 Drawing Sheets

5,506,159

METHOD FOR MANUFACTURING A SEMICONDUCTOR MEMORY DEVICE

BACKGROUND OF THE INVENTION (a) Field of the Invention

The present invention relates to a method for manufacturing a semiconductor memory device and, more particularly to a method for manufacturing a semiconductor memory device in which ion-implantation is separately performed in a memory cell portion and in a peripheral portion.

(b) Description of the Related Art

In general, a nonvolatile memory device such as an EPROM or a flash memory comprises a memory cell portion and a peripheral portion located adjacent thereto on a common chip. The memory cell portion is formed by an array of memory cells each implemented by an n-channel MOS transistor having a two-layer gate electrode structure, while the peripheral portion is formed by CMOS transistors having a single-layer gate electrode structure implementing multiplexers, a sense circuit, etc.

In forming such a nonvolatile memory device, conventional methods comprise a step of forming gate electrodes of n-channel transistors for both the memory cell portion and the peripheral portion in the same step, and a subsequent step of implanting As ions on the entire surface of the substrate to form diffused layers for the sources and drains of n-channel MOS transistors of both the memory cell portion and the peripheral portion, while covering the region for p-channel transistors of the peripheral portion with a photoresist layer.

SUMMARY OF THE INVENTION

It is an object of the present invention to provide a method for manufacturing semiconductor devices having transistors exhibiting better and more desirable characteristics than conventional ones both in a memory cell portion and a peripheral portion, without incurring an increase of costs.

The present invention is directed to a method for manufacturing a semiconductor memory device having a memory cell portion and a peripheral portion juxtaposed on a main surface of a semiconductor substrate, the method including steps of:

(a) forming a tunnel gate oxide film on the main surface in the memory cell portion;

(b) forming a first polysilicon film on the tunnel gate oxide film and patterning the first polysilicon film to obtain a floating gate layer;

(c) forming an insulating film on the floating gate layer and a gate oxide film on the main surface, respectively, in the peripheral portion, and subsequently forming a second polysilicon film overlying the main surface in the memory cell portion and the peripheral portion;

(d) patterning the second polysilicon film, the insulating film and floating gate layer in the memory cell portion to obtain a two-layer gate electrode structure without patterning the second polysilicon film in the peripheral portion;

(e) performing a first ion implantation on the main surface to form a first diffused layer in the memory cell portion, while keeping the peripheral portion covered with the second polysilicon film;

(f) patterning the second polysilicon film in the peripheral portion; and (g) performing a second ion implantation to form a second diffused layer in the peripheral portion.

The step (d) in the method according to the present invention may be performed by patterning the second polysilicon film, the insulating film and the floating gate layer in the memory cell portion to form a two-layer gate electrode structure, while leaving the second polysilicon in the peripheral portion not etched and leaving the second polysilicon film in the memory cell portion and the second polysilicon film in the peripheral portion connected with each other. Also, the step (e) (a first ion implantation) may be performed on the main surface of the substrate to form a first diffused layer in the memory cell portion, while keeping the second polysilicon film grounded.

With the present invention, the first ion implantation is performed in the step (e) by using the second polysilicon film in the peripheral portion as a mask and the second ion implantation may be performed in the step (g) by using the photoresist layer in the memory cell portion as a mask.

When the method according to the present invention is applied to forming n-channel transistors of the memory device, the method can form the first diffused layer in the memory cell portion and the second diffused layer in the peripheral portion at a respective optimum acceleration energy and a respective optimum dosage, respectively, independently of each other. Furthermore, it requires a photoresist layer in the memory cell portion only for forming the second diffused layer, but requires no photoresist layer for forming the first diffused layer, because the second ion implantation for the first diffused layer is performed by using a polysilicon film in the peripheral portion as a mask.

Accordingly, the method according to the present invention can manufacture a semiconductor memory device capable of exhibiting better and more desirable characteristics than conventional ones without incurring an increase of costs.

BRIEF DESCRIPTION OF THE DRAWINGS

The above and other objects, features and advantages of the present invention will be more apparent from the following description with reference to accompanying drawings in which.

DESCRIPTION OF THE PREFERRED EMBODIMENT

Before description of embodiments of the present invention, the prior art and problems involved therein will be described for the sake of better understanding of the present invention.

A conventional method for manufacturing MOS transistors is described, for example, in Japanese Patent Application Laid-open Publication No. 2-192723, which is called as a first conventional method, hereinafter.

Figure 1:
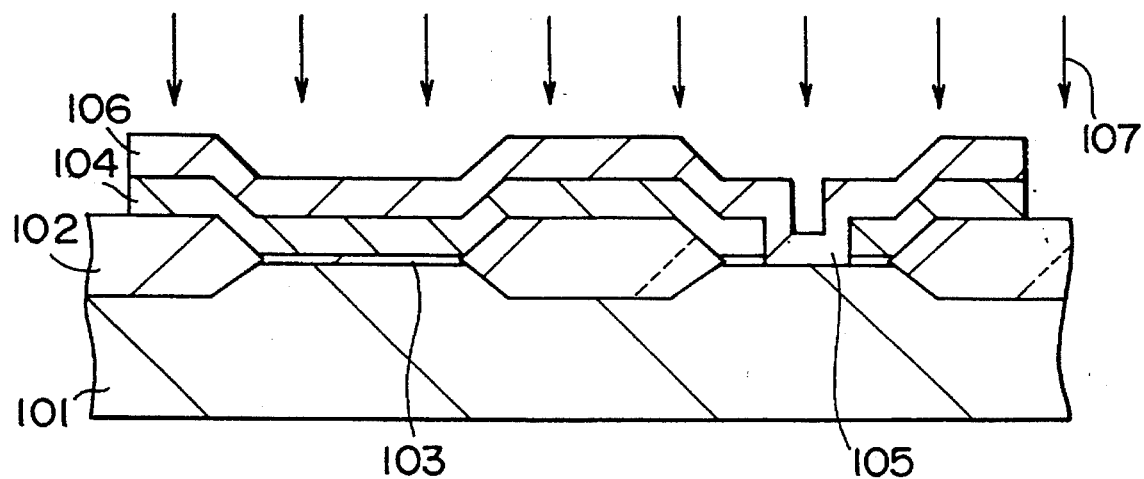
FIG. 1 is a cross-sectional view of a semiconductor device in a step of a first conventional method for manufacturing semiconductor devices.

First, as shown in FIG. 1, a LOCOS oxide film 102 is selectively formed on the main surface of a p-type silicon substrate 101 to isolate active regions and then a gate oxide film 103 is formed in each active region. Next, a polysilicon film 104 is formed overlying the entire surface of the substrate 101, following which the polysilicon film 104 and the gate oxide film 103 are selectively etched, until the silicon substrate 101 is exposed, to form an opening for a contact 105. Then, WSi layer 106 is formed on the entire surface of the substrate 101, following which the WSi layer 106 and the polysilicon film 104 are patterned to form a gate electrode layer having a contact 105 Next, an As ion implantation 107 is performed on the entire surface of the substrate 101 in order to form a diffused layer 108 for source and drain regions of a MOS transistor.

Figure 2:
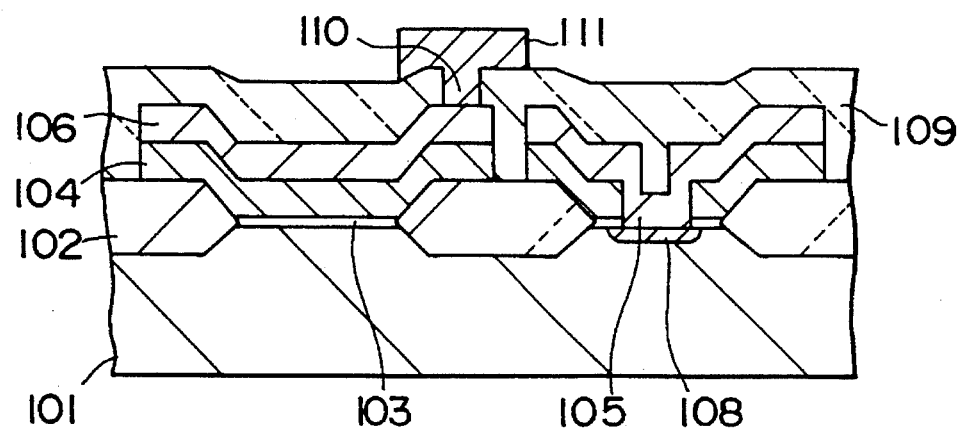
FIG. 2 is a cross-sectional view of the semiconductor device in another step of the first conventional method.

Next, a gate electrode structure is isolated from a portion of the gate electrode layer having a contact 105, as shown in FIG. 2, by patterning the WSi layer 106 and the polysilicon film 104. Then, a BPSG film is formed as an interlayer insulating film 109 overlying the entire surface of the substrate 101. Next, the interlayer insulating film 109 is selectively etched to form a through hole 110 for exposing a portion of the gate electrode layer 106, then an aluminum electrode 111 is formed to plug the through hole 110 and to communicate the gate electrode layer 106.

In the aforementioned method for manufacturing semiconductor devices, since the gate electrode WSi layer 106 is connected to the silicon substrate 101 through the contact 105, electrostatic charges generated in the gate electrode layer due to the As ion implantation 107 can be drained into the silicon substrate 101 through the contact 105, and thus build-up of electrostatic charges is avoided during the As ion implantation step.

Another conventional method for manufacturing semiconductor devices capable of avoiding build-up of electrostatic charges is described in Japanese Patent Application Laid-open Publication No. 63-314868, which is called as a second conventional method, hereinafter.

Figure 3:
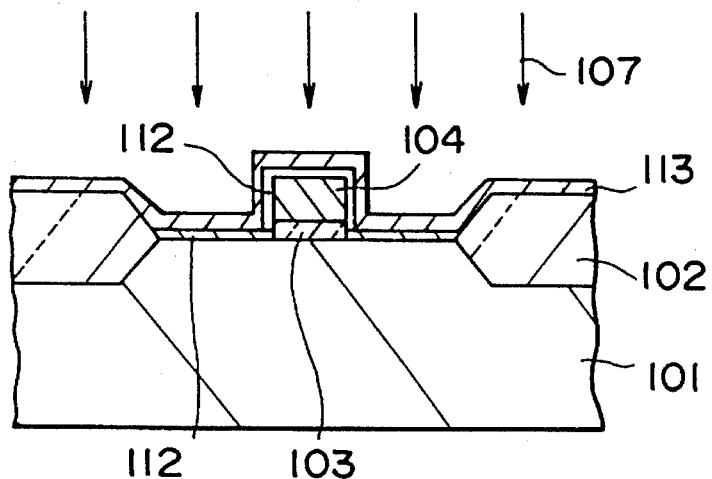
FIG. 3 is a cross-sectional view of a semiconductor device in a step of a second conventional method for manufacturing semiconductor devices.

As shown in FIG. 3, a LOCOS oxide film 102 is selectively formed on the main surface of a p-type silicon substrate 101 to isolate active regions and then a gate oxide film 103 is formed in each active region. Then, a polysilicon film 104 is formed overlying the entire surface of the substrate 101. The polysilicon film 104 and the gate oxide film 103 are etched to form a gate electrode structure. Then, by a thermal oxidation process, an oxide film 112 is formed on the surface of the polysilicon film 104 and the active regions of the substrate 101. Next, a conductive thin polysilicon film 113 is formed overlying the entire surface of the substrate 101.

Figure 4:
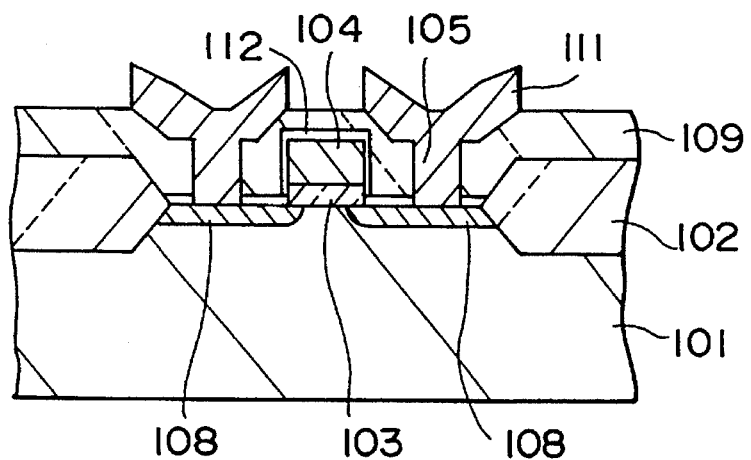
FIG. 4 is a cross-sectional view of the semiconductor device in another step of the second conventional method.

Then, an As ion implantation 107 is performed so that As ions reach the silicon substrate 101 through the thin polysilicon film 113 and the oxide film 112 to form n-diffused layer 108, as shown in FIG. 4. Next, the thin polysilicon film 113 is etched off, and an interlayer insulating film 109 is formed on the entire surface of the substrate 101. Then, openings for contacts are formed on the n-diffused layer 108, and aluminum electrodes 111 including the contacts 105 are formed. By grounding the thin polysilicon film 113 during the As ion implantation, build-up of electrostatic charges is avoided.

When the first conventional method is applied to manufacturing a nonvolatile semiconductor memory device having n-channel transistors both in the peripheral portion and in memory cell portion, the n-type diffused layers both in the peripheral portion and in memory cell portion are formed concurrently at the same acceleration energy and the same dosage in a single As ion implantation step.

Hence, when the diffused layer for the n-channel transistors in the peripheral portion are formed at an optimum acceleration energy and an optimum dosage, the n-channel transistors in the memory cell portions are not necessarily formed under optimum conditions, and vice versa. Accordingly, it is quite difficult to manufacture transistors having desirable performance in a semiconductor memory device, as far as the above-mentioned ion implantation is applied.

Meanwhile, to form two n-type diffused layers having different impurity concentrations and different depths from each other in two different portions, two steps of ion implantation are required, i.e. a step for an ion implantation performed only on the memory cell portion to form n-channel transistors therein and a step for an ion implantation performed only on the peripheral portion to form n-channel transistors therein. However, according to the first conventional method, each of two steps of the ion implatation requires forming and patterning a photoresist film. This leads to an increase of masking costs and thus to an increase of costs for manufacturing a semiconductor memory device.

Also, the second conventional method has disadvantages similar to those of the first conventional method mentioned above. Further, in the second conventional method, since a thin conductive film is formed on the top of a gate electrode as a measure for discharging electrostatic charges, an additional step for etching off the thin conductive film is required after the ion implantation, resulting in a cost increase. In addition the possibility of incurring damage or contamination to the memory cells during the etching of the thin conductive film is much increased.

The present invention will now be described with reference to the accompanying drawings. In FIGS. 11 through 16, a memory cell in a memory cell portion and an n-channel transistor and a p-channel transistor in a peripheral portion are arranged from the left to the right. Cross-sectional views of the semiconductor memory device along the lines a–b of FIGS. 11 through 16 correspond to FIGS. 5 through 10, respectively.

Figure 5:
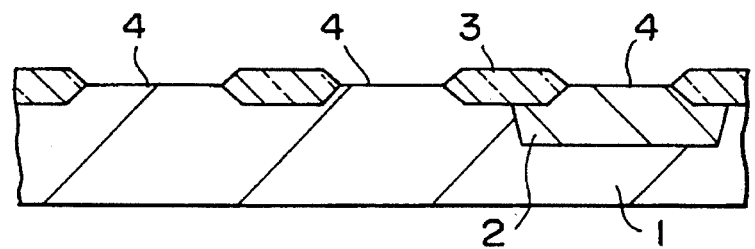
FIGS. 5 through 10 are cross-sectional views of a semiconductor device in consecutive steps of a method for manufacturing semiconductor memory devices according to an embodiment of the present invention.
Figure 11:
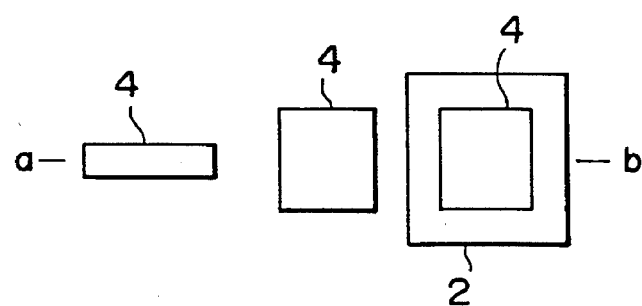
FIGS. 11 through 16 are schematic plan views showing patterns formed in the steps of FIGS. 5 through 10, respectively.

As shown in FIGS. 5 and 11, an n-well 2 is formed in a region of a p-type silicon substrate 1 to make a p-channel transistor for the peripheral portion of the memory device, and a LOCOS oxide film 3 is formed on the surface of the p-type silicon substrate 1 to isolate a field 4.

Figure 6:
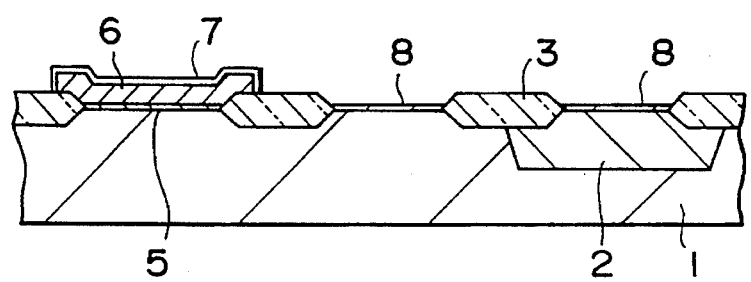
Figure 12:
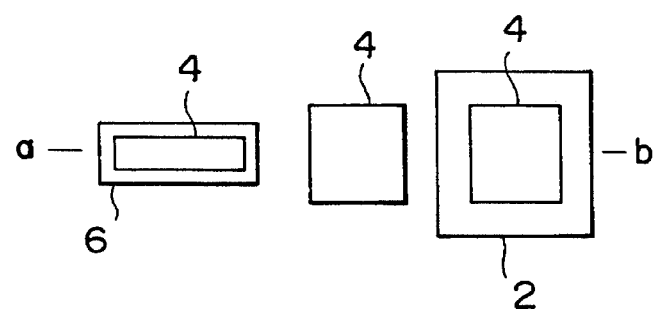

Next, as shown in FIGS. 6 and 12, a tunnel gate oxide film 5 having a thickness of about 100 angstroms is formed on the surface of the field 4 of the memory cell portion by thermal oxidation process. Then, a first polysilicon film having a thickness of about 1500 angstroms is formed overlying the entire surface of the substrate 1. A floating gate layer 6 is formed in the memory cell portion by patterning the first polysilicon film. By a thermal oxidation, an insulating film 7 is formed on the floating gate layer 6 and a gate oxide film 8 is formed on the surface of the field 4 in the peripheral portion, respectively.

Figure 7:
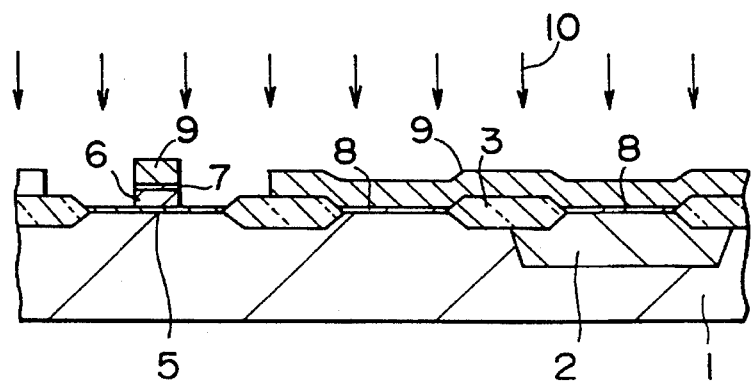
Figure 13:
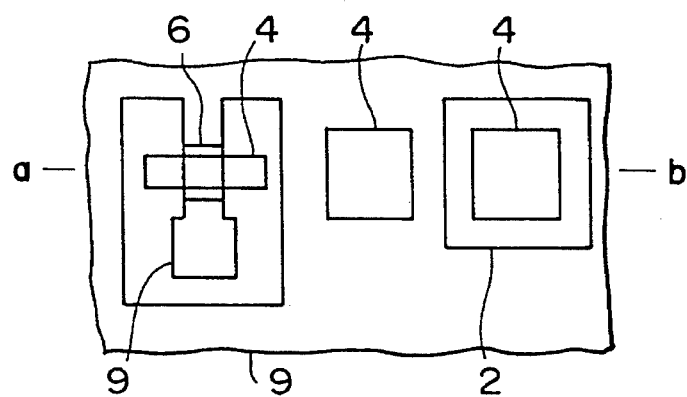

Next, as shown in FIGS. 7 and 13, a polysilicon film 9 having a thickness of about 2000 angstroms is formed overlying the entire surface of the substrate 1. Then, the polysilicon film 9, the insulating film 7 and floating gate layer 6 in the memory cell portion are selectively etched to form a two-layer gate electrode structure in the memory cell, while leaving the polysilicon film 9 in the peripheral portion not etched and connected to the polysilicon film 9 in the memory cell portion. Then, a first As ion implantation 10 is performed on the entire surface of the substrate at an acceleration energy of about 50 keV and a dosage of about $1 \times 10^{15}$ cm$^{-2}$ ions/cm$^2$ to form a first n+ diffused layer 11 in the memory cell portion. During this ion implantation step, no diffused layers are formed in the peripheral portion, because the polysilicon film 9 covers the peripheral portion. The accerelation energy may be preferably in the range between about 30 and about 60 KeV and the dosage may be preferably in the range between about $1 \times 10^{14}$ and about $3 \times 10^{15}$ ions/cm$^2$.

Figure 8:
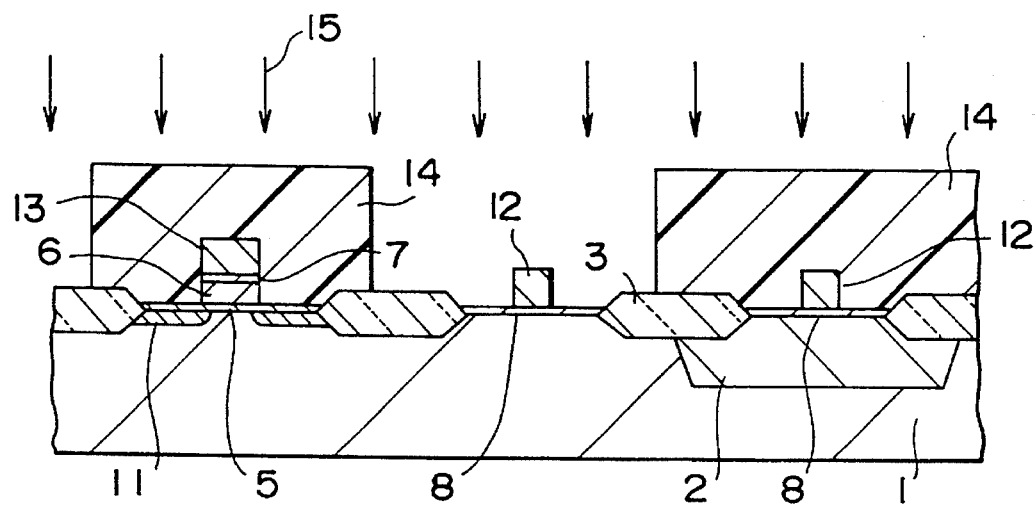
Figure 9:
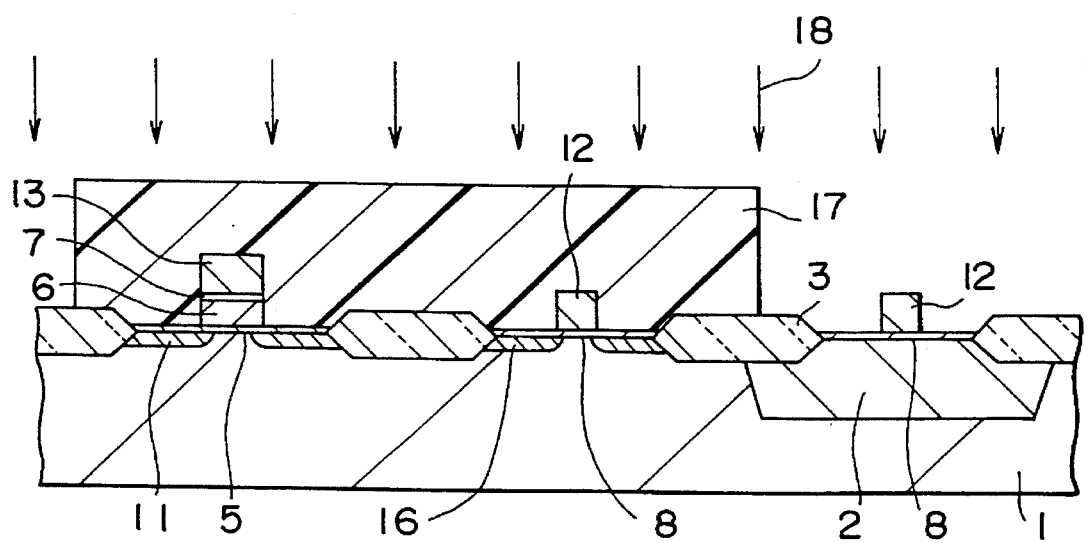
Figure 14:
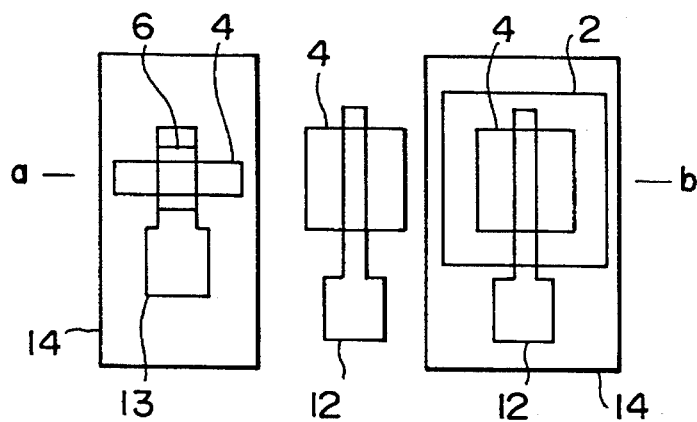
Figure 15:
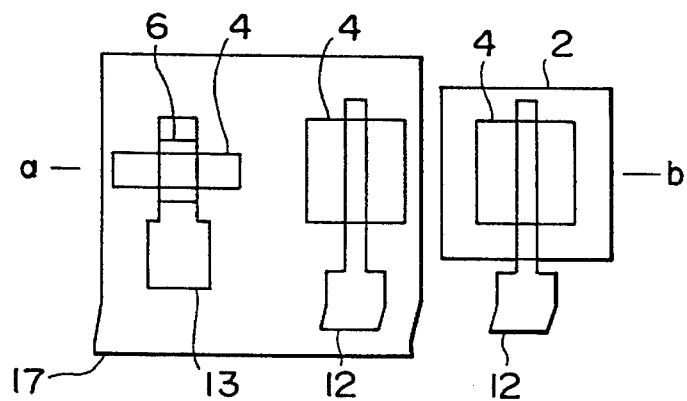

Next, as shown in FIGS. 8 and 14, the polysilicon film 9 in the peripheral portion is patterned to be disconnected from the polysilicon film 9 in the memory cell portion and to form a gate electrode 12, and at the same time the polysilicon film 9 in the memory cell portion is patterned to form a control gate 13. Then, a second As ion implantation 15 is performed at an acceleration energy of about 70 keV and a dosage of about $5 \times 10^{15}$ cm$^{-2}$ to form a second n+ diffused layer 16 in the n-channel region of the peripheral portion, after forming and patterning an (SDN) photoresist layer 14 to be used as a mask. The acceleration energy may be preferably in the range between about 40 and about 80 KeV and the dosage may be preferably in the range between about $1 \times 10^{15}$ and about $1 \times 10^{16}$ ions/cm.$^2$ Then, as shown in FIGS. 9 and 15, a Boron ion implantation 18 is performed at an acceleration energy of about 50 keV and a dosage of about $5 \times 10^{15}$ cm$^{-2}$ to form a p+ diffused layer 19, after forming and patterning a (SDN) photoresist layer 17 to be used as a mask.

Figure 10:
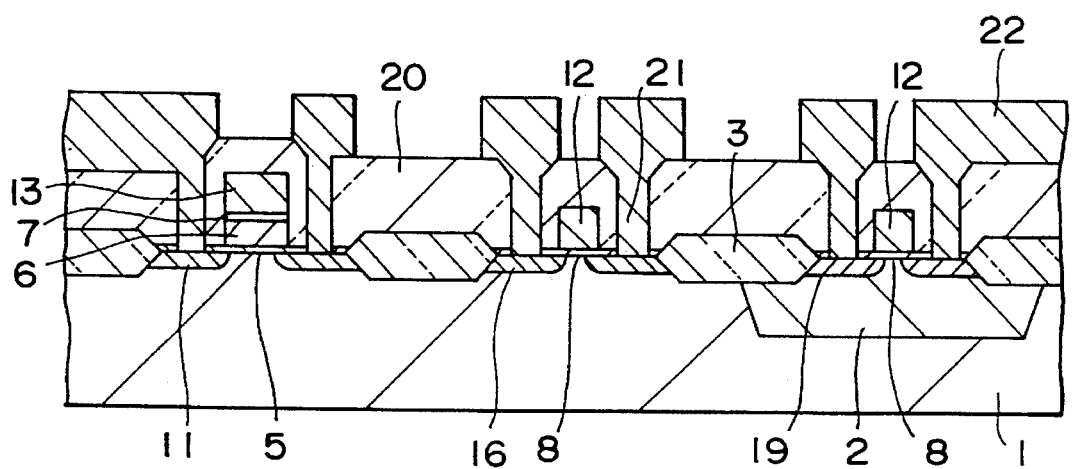
Figure 16:
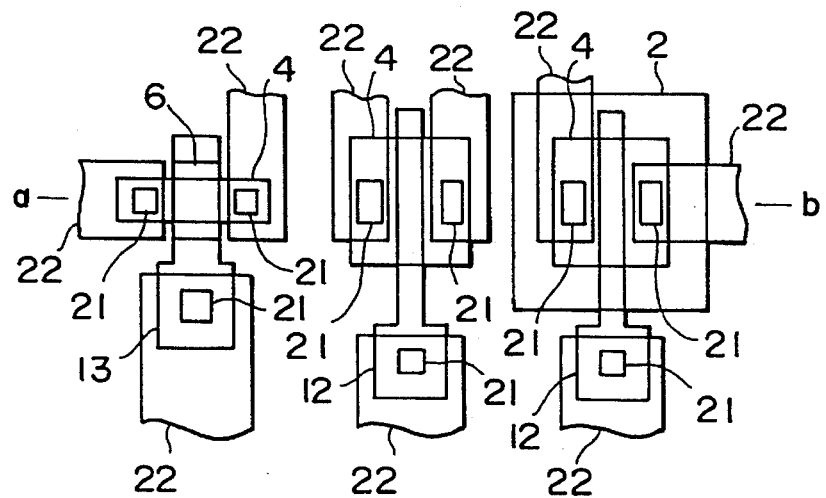

Next, as shown in FIGS. 10 and 16, a BPSG film 20 having a thickness of about 5000 angstroms is formed overlying the entire surface of the substrate 1. Then, openings for contacts 21 are formed on the first n+ diffused layer 11, the second n+ diffused layer 16, the p+ diffused layer 19, the control gate 13 and the gate electrode 12. Next, an aluminum interconnection layer 22 and contacts 21 are formed by sputterring and patterning technique.

According to the present embodiment, a first ion implantation is performed on the memory cell portion while the peripheral portion is covered with the second polysilicon film. On the other hand, in the peripheral portion, after the second polysilicon film is patterned to form a gate electrode, a second ion implantation is performed to form a diffused layer. Hence, the embodiment of the present invention can provide a memory device having a first diffused layer in a memory cell portion and a second diffused layer in a peripheral portion formed at an optimum acceleration energy and dosage, independently of each other. Furthermore, the two ion implantation steps require a photoresist layer only in the memory cell portion during forming the diffused layer in the peripheral portion, but requires no photoresist layer during forming the diffused layer in the memory cell portion, because the diffused layer in the memory cell portion is formed by using a polysilicon film in the peripheral portion as a mask. Thus, the masking cost for two steps of As ion implantation in the method of the present embodiment remains unchanged from the conventional methods.

In the above embodiment, in order to avoid build-up of electrostatic charges in control gates due to a first ion implantation, the second polysilicon film is patterned to form the control gate connected with the second polysilicon film in the peripheral portion, which is maintained grounded during the first ion implantation.

It is practical to modify, as required, the structure of the n+ diffused layer in the memory cell portion of the above-mentioned embodiment. For example, when it is required to employ a Double Doped Drain structure in the memory cell portion and a single drain structure in the peripheral portion, respectively, the above-mentioned embodiment is modified as detailed below.

A phosphorous (P) ion implantation is performed in place of the first As ion implantation 10 shown in FIG. 7, then, SDN photoresist layer 14 is formed covering the entire main surface of the substrate. Next, the SDN photoresist layer 14 only in the memory cell portion shown in FIG. 8 is removed, while leaving the SDN photoresist layer 14 remaining in the p-channel region and the n-channel region of the peripheral portion. Then, a single As ion implantation is performed.

Also, when it is required to employ a Lightly Doped Drain structure in the memory cell portion and a single drain structure in the peripheral portion, respectively, the above-mentioned embodiment is modified as detailed below.

After patterning the polysilicon film 9 as shown in FIG. 7, phosphorous (P) ion implantation is performed in place of the first As ion implantation 10 and then a side wall oxide film is formed around gate electrodes of the memory cell portion. Then, a single As ion implantation is performed.

Also, the insulating film on the surface of the floating gate may be formed with a laminate including an oxide film, a nitride film, an oxide film, etc., in place of a single-layer oxide film.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A method for manufacturing a semiconductor device having a memory cell portion and a peripheral portion juxtaposed on a main surface of a semiconductor substrate, said method including steps of:

(a) forming a tunnel gate oxide film on said main surface in said memory cell portion;

(b) forming a first polysilicon film on said tunnel gate oxide film and patterning said first polysilicon film to obtain a floating gate layer;

(c) forming an insulating film on said floating gate layer and a gate oxide film on said main surface, respectively, in said peripheral portion, and subsequently forming a second polysilicon film overlying said main surface in said memory cell portion and said peripheral portion;

(d) patterning said second polysilicon film, said insulating film and floating gate layer in said memory cell portion to obtain a two-layer gate electrode structure without patterning said second polysilicon film in said peripheral portion, a portion of said second polysilicon film remaining in said memory cell portion and connected to said second polysilicon film in said peripheral portion;

(e) performing a first ion implantation on said main surface, while said second polysilicon film is grounded, to form first diffused regions in said memory cell portion, while keeping said peripheral portion covered with said second polysilicon film;

(f) patterning said second polysilicon film in said peripheral portion wherein said portion of said second polysilicon film remaining in said memory cell portion is disconnected from said second polysilicon film in said peripheral portion; and (g) performing a second ion implantation to form second diffused regions in said peripheral portion.

2. A method for manufacturing a semiconductor device as defined in claim 1 wherein said first ion implantation is performed using As ions at an acceleration energy between about 30 and 60 KeV and a dosage between about $1\times10^{14}$ and $3\times10^{15}$ ions/cm$^2$.

3. A method for manufacturing a semiconductor device as defined in claim 1 wherein said second ion implantation is performed using As ions at an acceleration energy between about 40 and 80 KeV and a dosage between about $1\times10^{15}$ and $1\times10^{16}$ ions/cm$^2$.

* * * * *